United States Patent
Koch, II et al.

(10) Patent No.: US 6,882,201 B1
(45) Date of Patent: Apr. 19, 2005

(54) TRIPLE REDUNDANT LATCH DESIGN USING A FAIL-OVER MECHANISM WITH BACKUP

(75) Inventors: Kenneth Koch, II, Fort Collins, CO (US); Manuel Cabanas-Holmen, Longmont, CO (US); Daniel W. Krueger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/754,075

(22) Filed: Jan. 7, 2004

(51) Int. Cl.[7] .................. H03K 3/037; H03K 3/356
(52) U.S. Cl. .................. 327/199; 327/208; 327/218
(58) Field of Search .................. 327/199, 200, 327/201, 208–212, 218; 326/10, 11, 12; 365/156; 714/700

(56) References Cited

U.S. PATENT DOCUMENTS

| | | | | |
|---|---|---|---|---|
| 5,111,429 A | * | 5/1992 | Whitaker | 365/156 |
| 5,311,070 A | * | 5/1994 | Dooley | 327/208 |
| 5,870,332 A | * | 2/1999 | Lahey et al. | 365/156 |
| 6,127,864 A | * | 10/2000 | Mavis et al. | 327/144 |
| 6,504,411 B1 | * | 1/2003 | Cartagena | 327/199 |

* cited by examiner

Primary Examiner—Tuan T. Lam
(74) Attorney, Agent, or Firm—John Pessetto

(57) ABSTRACT

In a preferred embodiment, the invention provides a circuit and method for a smaller and faster triple redundant latch. An input driver is connected to the input of two transfer gates. The output of one transfer gate is connected to an I/O of a first latch and the output of the second transfer gate is connected to the I/O of a second latch. The I/O of the first latch is connected to a first input of a tristatable input inverter. The I/O of the second latch is connected to a second input of the tristatable input inverter. The output of the tristatable input inverter is connected to the I/O of a third latch and the input of an output driver.

18 Claims, 3 Drawing Sheets

US 6,882,201 B1

TRIPLE REDUNDANT LATCH DESIGN USING A FAIL-OVER MECHANISM WITH BACKUP

FIELD OF THE INVENTION

This invention relates generally to latch design. More particularly, this invention relates to improving soft error immunity in latches.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of a latch, the charge that accumulates could exceed the minimum charge that is needed to "flip" the value stored on the latch, resulting in a soft error.

The smallest charge that results in a soft error is called the critical charge of the latch. The rate at which soft errors occur (SER) is typically expressed in terns of failures in time (FIT).

A common source of soft errors are alpha particles which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (a neutron can easily pass through five feet of concrete). This effect varies with both latitude and altitude. In London, the effect is two times worse than on the equator. In Denver, Colo. with its mile-high altitude, the effect is three times worse than at sea-level San Francisco. In a commercial airplane, the effect can be 100–800 times worse than at sea-level.

Radiation induced soft errors are becoming one of the main contributors to failure rates in microprocessors and other complex ICs (integrated circuits). Several approaches have been suggested to reduce this type of failure. Adding ECC (Error Correction Code) or parity in data paths approaches this problem from an architectural level. Adding ECC or parity in data paths can be complex and costly.

At the circuit level, SER may be reduced by increasing the ratio of capacitance created by oxides to the capacitance created by p/n junctions. The capacitance in a latch, among other types, includes capacitance created by p/n junctions and capacitance created by oxides. Since electron/holes pairs are created as high-energy neutrons pass through a p/n junction, a reduction in the area of p/n junctions in a latch typically decreases the SER. Significant numbers of electron/hole pairs are not created when high-energy neutrons pass through oxides. As a result, the SER may typically be reduced by increasing the ratio of oxide capacitance to p/n junction capacitance in a SRAM cell.

There is a need in the art to reduce the SER in latches. An embodiment of this invention reduces the SER in latches while adding only a small increase in physical size of the latch and a small increase in the delay time through the latch.

SUMMARY OF THE INVENTION

In a preferred embodiment, the invention provides a circuit and method for a smaller and faster triple redundant latch. An input driver is connected to the input of two transfer gates. The output of one transfer gate is connected to an I/O of a first latch and the output of the second transfer gate is connected to the I/O of a second latch. The I/O of the first latch is connected to a first input of a tristatable input inverter. The I/O of the second latch is connected to a second input of the tristatable input inverter. The output of the tristatable input inverter is connected to the I/O of a third latch and the input of an output driver. The output of the output driver is the output of the triple redundant latch.

This preferred embodiment allows a reduction in the size of a triple redundant latch with only a small increase in the delay time through the latch.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
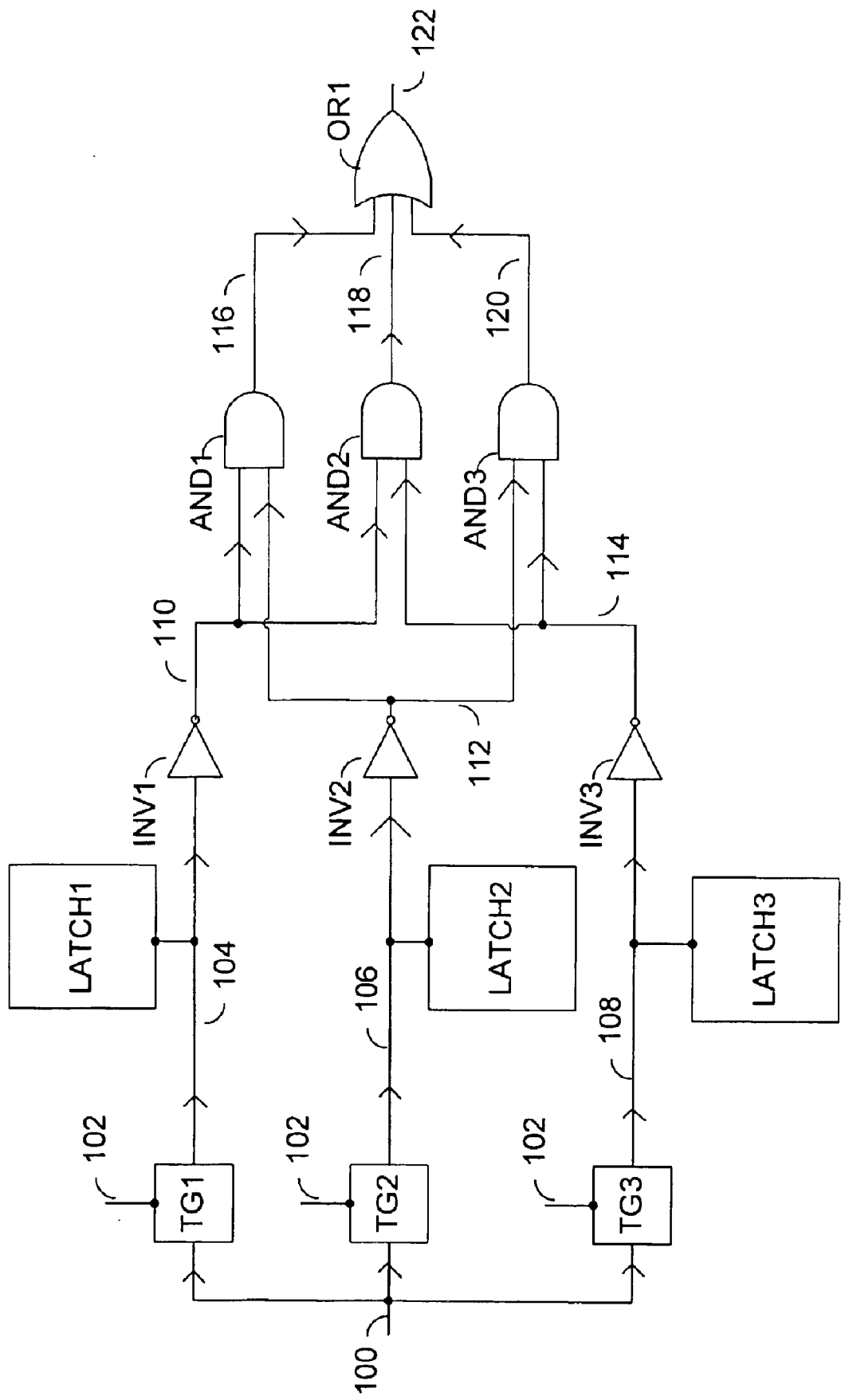
FIG. 1 is a schematic of a triple redundant latch. Prior Art

FIG. 1 is a schematic of a triple redundant latch. The input, 100, to the triple redundant latch is connected to the input of transfer gates, TG1, TG2, and TC3. Control signal, 102, is connected to transfer gates, TG1, TG2, and TG3. Control signal, 102, controls when the signal on the input of transfer gates, TG1, TG2, and TG3 is transferred to the outputs, 104, 106, and 108 of transfer gates, TG1, TG2, and TG3 respectively. The signal presented to outputs, 104, 106, and 108, is stored in LATCH1, LATCH2, and LATCH3 respectively.

After control signal, 102, is turned off, the signal on LATCH1 drives the input of inverter, INV1. After control signal, 102, is turned off, the signal on LATCH2 drives the input of inverter, INV2. After control signal, 102, is turned off, the signal on LATCH3 drives the input of inverter, INV3. The output, 110, of inverter, INV1, drives an input to AND1 and an input to AND2. The output, 112, of inverter, INV2, drives an input to AND1 and an input to AND3. The output, 114, of inverter, INV3, drives an input to AND2 and an input to AND3. The output, 116, of AND1 drives an input of OR1. The output, 118, of AND2 drives an input of OR1. The output, 120, of AND3 drives an input of OR1. The output of the triple redundant latch is the output, 122 of OR1.

A triple redundant latch reduces soft errors by storing the same data in three different latches. For example, when the control signal, 102 is on, a logical high value may be driven from the inputs, 100, of transfer gates, TG1, TG2, and TG3 to the outputs, 104, 106, and 108, of transfer gates, TG1, TG2, and TG3 respectively. After turning control signal 102 off, a logical high value is stored in latches, LATCH1, LATCH2, and LATCH3. The stored high value on LATCH1 drives the input of inverter, INV1, and produces a logical low value on the output, 110, of inverter, INV1. The stored high value on LATCH2 drives the input of inverter, INV2, and produces a logical low value on the output, 112, of inverter, INV2. The stored high value on LATCH3 drives the input of inverter, INV3, and produces a logical low value on the output, 114, of inverter, INV3.

Since the output, 110, 112, and 114 of inverters, INV1, INV2, and INV3, respectively, are low, all the inputs, 110, 112, and 114 to AND1, AND2, and AND3 respectively are a logical low value. Since all the inputs, 110, 112, and 114, to AND1, AND2, and AND3 respectively are a logical low value, the output, 116, 118, and 120 of AND1, AND2, and AND3 respectively are a logical low value. Since the output, 116, 118, and 120 of AND1, AND2, and AND3, respectively are a logical low value, all the inputs of OR1 are a logical low value. Since all the inputs, 116, 118, and 120 to OR1 are logical low value, the output, 122, is logical low value.

If a soft error occurs, for example, in LATCH2, and changes the stored logical value from a logical high value to a logical low value, a logical low value is now presented to the input, 106, of inverter, INV2. The output, 112, of inverter, INV2, presents a logical high value to an input of AND1 and AND3. Since, in this example, the other input, 110 to AND1 and the other input, 114, to AND3, is a logical low value, the output, 116 and 120 of AND1 and AND3 respectively remains a logical low value and the output, 122, does not change. This example illustrates how a single soft error in one latch does not change the original stored value in a triple redundant latch.

As a further example, assume, in addition to the soft error in LATCH2, there is an additional soft error in LATCH3. Now, the input, 108, to inverter, INV3, is a logical low value and as a result, the output, 114, of inverter, INV3, is a logical high value. A logical high value in now presented to an input, 114, of AND2, and to an input, 114, of AND3. Since a logical low and logical high valued are presented on the inputs of AND1, the output, 116 of AND1 is still a logical low value. Since a logical low and logical high valued are presented on the inputs of AND2, the output, 118 of AND2 is still a logical low value. However, since inputs, 112 and 114, to AND3 are a logical high value, the output, 120, is a logical high value. Since input, 120, to OR1 is a logical high value, the output, 122, changes from a logical low value to a logical high value. This example illustrates how soft errors in two latches of a triple redundant latch does change the original stored value of the triple redundant latch.

A triple redundant latch prevents a single soft error from changing the original value stored in the latch. However, this comes at the cost of additional circuitry which results in a physically larger latch. In addition, a triple redundant may introduce time delay in the delay path of the latch. As consequence, a triple redundant latch is usually larger and slower than a single latch.

Figure 2:
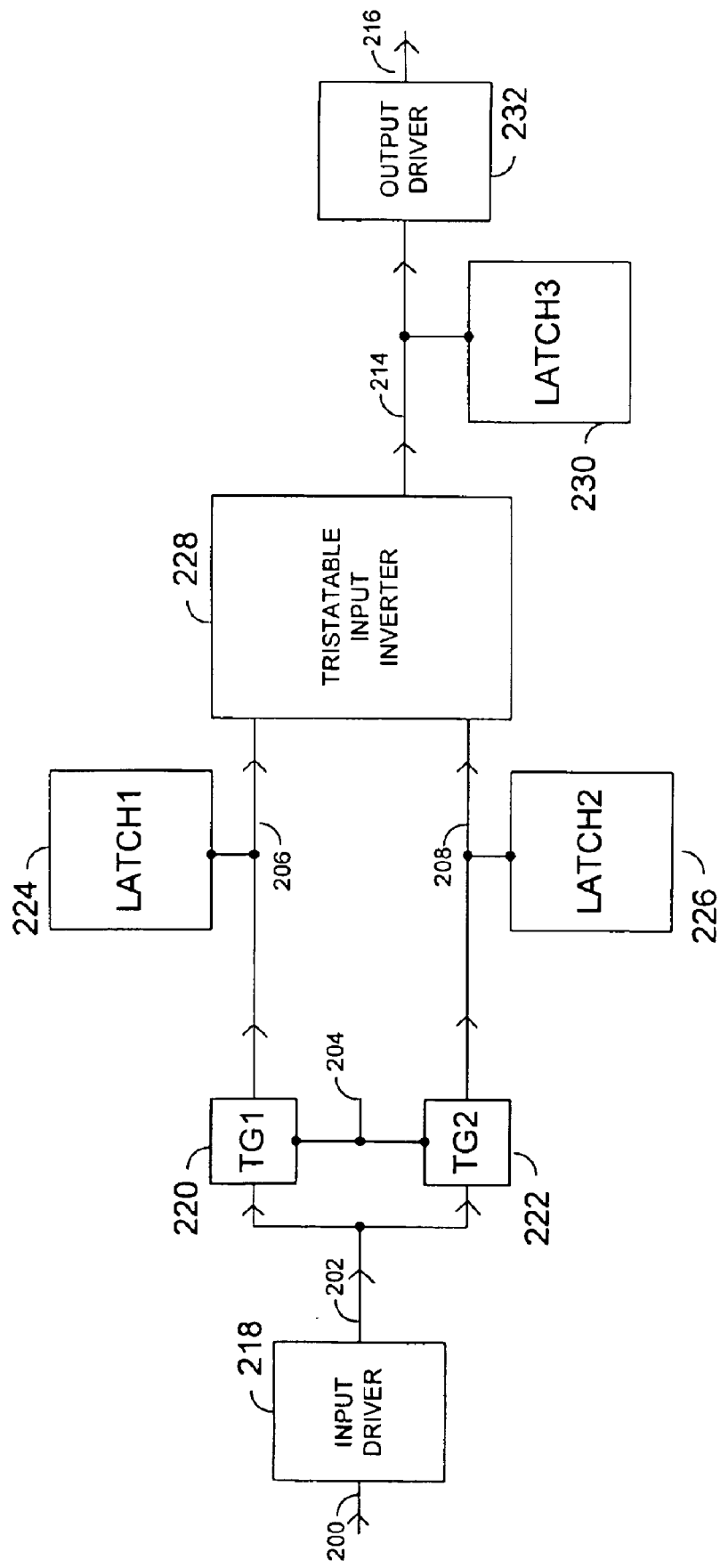
FIG. 2 is a schematic of an improved triple redundant latch.

FIG. 2 is a schematic of an improved triple redundant latch. An input driver, 218, receives a signal at its input, 200, and drives a signal from its output, 202, to the inputs, 202, of transfer gates, TG1, 220, and TG2, 222. In addition, a tristatable input inverter, a cross-coupled NAND gate, and a cross-coupled NOR gate may used in place of a transfer gate. If the control signal, 204 is on, the signal at the input, 202, of transfer gates, TG1, 220, and TG2, 222 is transferred to the output, 206, of transfer gate, TG1, 220 and to the output, 208, of transfer gate, TG2, 222. The same signal is stored in LATCH1, 224, and LATCH2, 226.

After control input, 204, is turned off, LATCH1, 224, and LATCH2, 226 retain the same signal. The signal stored in LATCH1, 224, and LATCH2, 226, is then applied to the inputs of the tristatable input inverter, 228. A tristatable input inverter, 228, actively drives a logical high value on the output, 214, when both inputs, 206 and 208, are logical low values. A tristatable input inverter, 228, actively drives a logical low value on the output, 214, when both inputs, 206 and 208, are logical high values. When the inputs, 206 and 208, have opposite logical values, the output, 214, of the tristable input inverter, 228, is tristated.

In this example, if neither of the latches, LATCH1, 224, and LATCH2, 226, is disturbed, then a signal of the same sense is presented on each of the two inputs, 206 and 208, of the tristatable input inverter, 228. For example, if a logical high value is stored in each latch, LATCH1, 224, and LATCH2, 226, then a logical high value is presented on each of the inputs of the tristatable input inverter, 228. In this example, since both inputs, 206 and 208, are a logical high value, the output, 214, of the tristatable input inverter, 228, is a logical low value. The logical low value on the output, 228, of the tristatable input inverter, 228, is then stored in the latch, LATCH3, 230. In this example, the logical low value presented to input, 214, of the output driver, 232, is driven to the output, 216, of the output driver, 232. Depending on the particular application, the output, 216, of the output driver may or may not be the same sense as the input, 214, to the output driver, 232.

If in this example where a logical high value is stored in latches, LATCH1, 224 and LATCH2, 226, LATCH1, 224, for example, is flipped to a logical low value by a soft error event, a logical low value is then presented to input, 206, of the tristatable input inverter, 228. Input, 208, remain a logical high value. When the inputs, 206 and 208, are the opposite sense, the output, 214, of the tristatable input inverter, 228, is tristated. Because the output, 214, of the tristatable input inverter, 228, is tristated, the logical value on node 214, remains a logical low value. Because the logical value on node 214 remains a logical low value, the triple redundant latch retains the original value stored in it. In this example, a single soft error did not change the original value stored in the triple redundant latch.

If, however, a soft error event changes the value stored in LATCH1, 224 and another softer error event changes the value stored in LATCH2, 226, the triple redundant latch will change from its original value. For example, if a logical high value is stored in the triple redundant latch, LATCH1, 224, and LATCH2, 226 each will retain a logical high value and LATCH3, 230, will retain a logical low value. If a soft error event changes the logical value stored in LATCH1, 224, from a logical high value to a logical low value and another soft error event changes the logical value stored in LATCH2, 226, from a logical high value to a logical low value, the inputs, 206 and 208, into the tristatable input inverter, 228, change from logical high values to logical low values. As a result of having logical low values on the inputs, 206 and 208, of the tristatable input inverter, 228, the output, 214, of the tristatable input inverter, 228, is a logical high value. Since the output, 214, is a logical high value, the value stored on LATCH3, 230, changes from a logical low value to a logical high value. In this example, the original value stored in the triple redundant latch is changed from a logical high value to a logical low value.

In addition to improving the soft error rate of a latch, the triple redundant latch shown in FIG. 2, also reduces the physical size of a triple redundant latch because it uses fewer transistors. The triple redundant latch shown in FIG. 2 also reduces the delay time through a triple redundant latch because the number of logic delays has been reduced.

Figure 3:
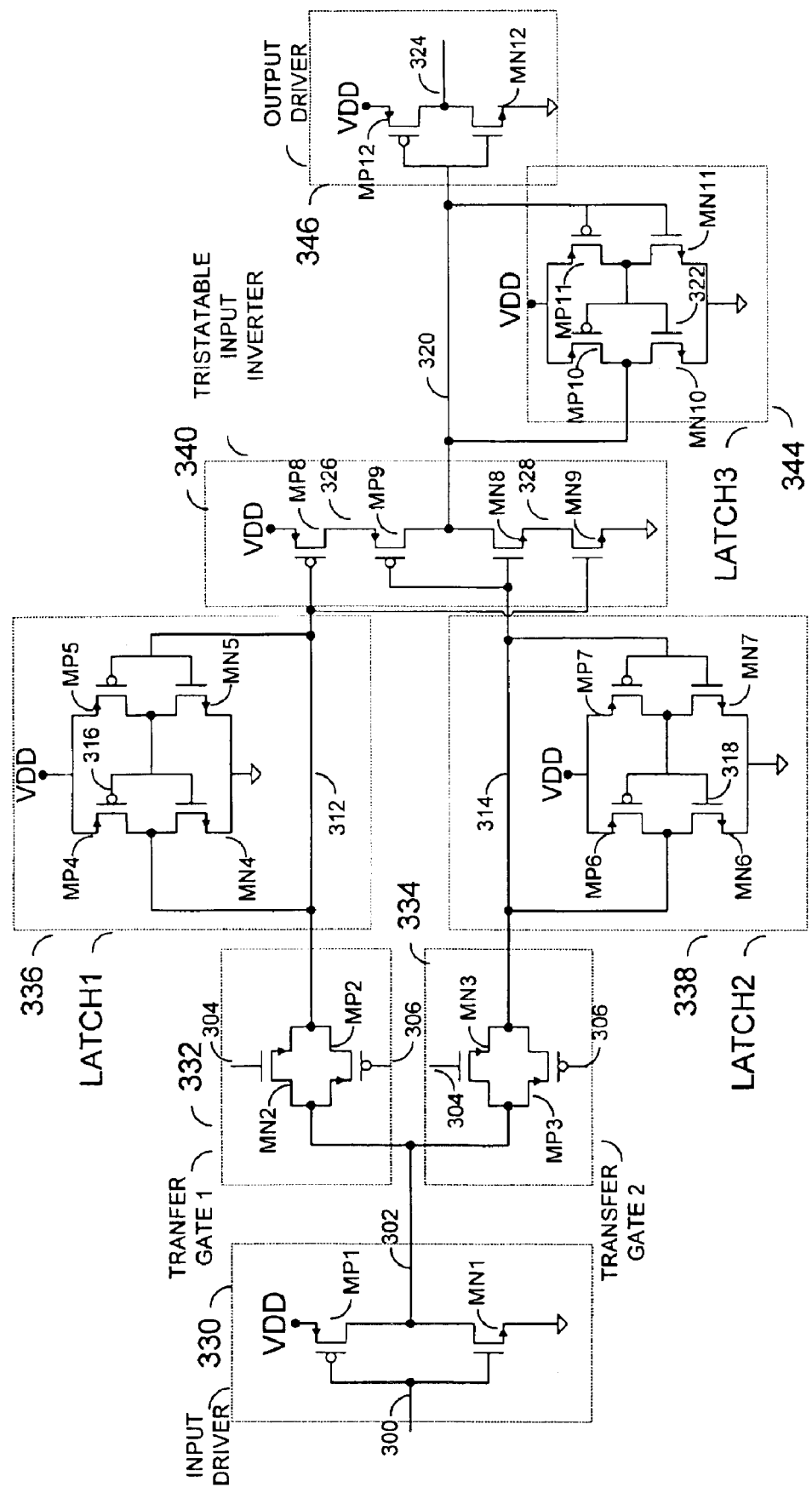
FIG. 3 is a schematic of an improved triple redundant latch.

FIG. 3 is a schematic of an improved triple redundant latch. FIG. 3 contains the same basic blocks that FIG. 2 contains; input driver, 330, transfer gate 1, 332, transfer gate 2, 334, LATCH1, 336, LATCH2, 338, tristatable input inverter, 340, LATCH3, 344, and output driver, 346. An embodiment of an input driver, 330, for the triple redundant latch contains a PFET, MP1 and an NFET, MN1. In this embodiment, the source of the PFET, MP1 is connected to VDD, the drain, 302, is connected to the output of the input driver, 330, and the drain of the NFET, MN1. The gates, 300, of the PFET, MP1, and the NFET, MN1, are connected to the input of the input driver, 330. The source of the NFET, MN1, is connected to GND.

An embodiment of a transfer gate 1, 332, for the triple redundant latch contains a PFET, MP2 and an NFET MN2.

In this embodiment, the drains of PFET, MP2, and NFET, MN2, are connected to the input, 302, of transfer gate 1, 332. The sources of PFET, MP2, and NFET, MN2, are connected to the output, 312, of transfer gate 1, 332. The gate of PFET, MP2, is connected to the control input, 306, of transfer gate 1, 332. The gate of NFET, MN2, is connected to the control input, 304, of transfer gate 1, 332.

An embodiment of a transfer gate 2, 334, for the triple redundant latch contains a PFET, MP3 and an NFET MN3. In this embodiment, the drains of PFET, MP3, and NFET, MN3, are connected to the input, 302, of transfer gate 2, 334. The sources of PFET, MP3, and NFET, MN3, are connected to the output, 314, of transfer gate 2, 334. The gate of PFET, MP3, is connected to the control input, 306, of transfer gate 2, 334. The gate of NFET, MN3, is connected to the control input, 304, of transfer gate 1, 334.

An embodiment of LATCH1, 336, for the triple redundant latch contains PFET, MP4, NFET, MN4, PFET, MP5, and NFET, MN5. In this embodiment, the drains of PFET, MP4, and NFET, MN4, and the gates of PFET, MP5 and NFET, MN5, are connected to I/O, 312, of LATCH1, 336. The drains of PFET, M5, and NFET, MN5, and the gates of PFET, MP4 and NFET, MN4, are connected to node, 316, of LATCH1, 336. The sources of PFETs, MP4 and MP5, are connected to VDD. The sources of NFETs, MN4 and MN5, are connected to GND.

An embodiment of LATCH2, 338, for the triple redundant latch contains PFET, MP6, NFET, MN6, PFET, MP7, and NFET, MN7. In this embodiment, the drains of PFET, MP6, and NFET, MN6, and the gates of PFET, MP7 and NFET, MN7, are connected to I/O, 314, of LATCH2, 338. The drains of PFET, MP7, and NFET, MN7, and the gates of PFET, MP6 and NFET, MN6, are connected to node, 318, of LATCH2, 338. The sources of PFETs, MP6 and MP7, are connected to VDD. The sources of NFETs, MN6 and MN7, are connected to GND.

An embodiment of a tristatable input inverter, 340, for the triple redundant latch contains PFET, MP8, PFET, MP9, NFET, MN8, and NFET, MN9. In this embodiment, the drains of PFET, MP9, and NFET, MN8, are connected to the output, 320, of the tristatable input inverter, 340. The drain of PFET, MP8, and the source of PFET, MP9 are connected to node, 326. The drain of NFET, MN9, and the source of NFET, MN8 are connected to node, 328. The gate of PFET, MP8, and the gate of NFET, MN9, are connected to an input, 312, of tristatable input inverter, 340. The gate of PFET, MP9, and the gate of NFET, MN8, are connected to an input, 314, of tristatable input inverter, 340. The source of PFET, MP8 is connected to VDD. The sources of NFET, MN9, are connected to GND.

An embodiment of LATCH3, 344, for the triple redundant latch contains PFET, MP10, NFET, MN10, FET, MP11, and NFET, MN1. In this embodiment, the drains of PFET, MP10, and NFET, MN10, and the gates of PFET, MP11 and NFET, MN11, are connected to I/O, 320, of LATCH3, 344. The drains of PFET, MP11, and NFET, MN11, and the gates of PFET, MP10 and NFET, MN10, are connected to node, 322, of LATCH3, 344. The sources of PFETs, MP10 and MP1, are connected to VDD. The sources of NFETs, MN10 and MN11, are connected to GND.

An embodiment of an output driver, 346, for the triple redundant latch contains a PFET, MP12 and an NFET, MN12. In this embodiment, the source of the PFET, MP12 is connected to VDD, the drain, 324, is connected to the output of the output driver, 346, and the drain of the NFET, MN12. The gates, 320, of the PFET, MP12, and the NFET, MN12, are connected to the input of the input driver, 346. The source of the NFET, MN12, is connected to GND.

FIG. 3 is a schematic of an improved triple redundant latch. An input driver, 330, receives a signal at its input, 300, and drives a signal from its output, 302, to the inputs, 302, of transfer gate 1, 332, and transfer gate 2, 334. If control signal, 304 is a logical high value and control signal, 306, is a logical low value, the signal at the input, 302, of transfer gate 1, 332, and transfer gate 2, 334 is transferred to the output, 312, of transfer gate 1, 332 and to the output, 314, of transfer gate 2, 334. The same signal is stored in LATCH1, 336, and LATCH2, 338.

After control input, 304, is driven to a logical low value, and control input, 306, is driven to a logical high value, LATCH1, 336, and LATCH2, 338 retain the same signal. The signal stored in LATCH1, 336, and LATCH2, 338, is then applied to the inputs of the tristatable input inverter, 340. If neither of the latches, LATCH1, 336, and LATCH2, 338, is disturbed, then a signal of the same sense is presented on each of the two inputs, 312 and 314, of the tristatable input inverter, 340. For example, if a logical high value is stored in each latch, LATCH1, 336, and LATCH2, 338, then a logical high value is presented on each of the inputs, 312 and 314, of the tristatable input inverter, 340. In this example, since both inputs, 312 and 314, are a logical high value, the output, 320, of the tristatable input inverter, 340, is a logical low value. The logical low value on the output, 320, of the tristatable input inverter, 340, is then stored in the latch, LATCH3, 344. In this example, the logical low value presented to input, 320, of the output driver, 346, is driven to a logical one at the output, 324, of the output driver, 346.

If in this example where a logical high value is stored in latches, LATCH1, 336 and LATCH2, 338, LATCH1, 336, for example, is flipped to a logical low value by a soft error event, a logical low value is then presented to input, 312, of the tristatable input inverter, 340. Input, 314, remain a logical high value. When the inputs, 312 and 314, are the opposite sense, the output, 320, of the tristatable input inverter, 340, is tristated. Because the output, 320, of the tristatable input inverter, 340, is tristated, the logical value on node 320, remains a logical low value. Because the logical value on node 320 remains a logical low value, the triple redundant latch retains the original value stored in it. In this example, a single soft error did not change the original value stored in the triple redundant latch.

If, however, a soft error event changes the value stored in LATCH1, 336 and another softer error event changes the value stored in LATCH2, 338, the triple redundant latch will change from its original value. For example, if a logical high value is stored in the triple redundant latch, LATCH1, 336, and LATCH2, 338 each will retain a logical high value and LATCH3, 344, will retain a logical low value. If a soft error event changes the logical value stored in LATCH1, 336, from a logical high value to a logical low value and another soft error event changes the logical value stored in LATCH2, 338, from a logical high value to a logical low value, the inputs, 312 and 314, into the tristatable input inverter, 340, change from logical high values to logical low values. As a result of having logical low values on the inputs, 312 and 314, of the tristatable input inverter, 340, the output, 320, of the tristatable input inverter, 340, is a logical high value. Since the output, 340, is a logical high value, the value stored on LATCH3, 344, changes from a logical low value to a logical high value. In this example, the original value stored in the triple redundant latch is changed from a logical high value to a logical low value.

In addition to improving the soft error rate of a latch, the triple redundant latch shown in FIG. 3, also reduces the physical size of a triple redundant latch because it uses fewer transistors. The triple redundant latch shown in FIG. 3 also reduces the delay time through a triple redundant latch because the number of logic delays is reduced.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A triple redundant latch for reducing soft errors comprising:
    a) an input driver, the input driver having an input and an output;
    b) a first transfer gate, the first transfer gate having an input, a first control input, a second control input and an output;
    c) a second transfer gate, the second transfer gate having an input, a first control input, a second control input, and an output;
    d) a first latch, the first latch having an input/output;
    e) a second latch, the second latch having an input/output;
    f) a third latch, the third latch having an input/output;
    g) a tristatable input inverter, the tristatable input inverter having a first input, a second input, and an output;
    h) an output driver, the output driver having an input and an output;
    i) wherein the input of the input driver is the input of the triple redundant latch;
    j) wherein the output of the input driver is connected to the input of the first transfer gate and to the input of the second transfer gate;
    k) wherein a first control input of the triple redundant latch is connected to the first control input of the first latch and to the first control input of the second latch;
    l) wherein a second control input of the triple redundant latch is connected to the second control input of the first latch and to the second control input of the second latch;
    m) wherein the output of the first transfer gate is connected to the input/output of the first latch and to the first input of the tristatable inverter;
    n) wherein the output of the second transfer gate is connected to the input/output of the second latch and to the second input of the tristatable inverter;
    o) wherein the output of the tristatable inverter is connected to the input/output of the third latch and to the input of the output driver;
    p) wherein the output of the output driver is the output of the triple redundant latch.

2. The triple redundant latch as in claim 1 wherein input driver comprises:
    a) a PFET, the PFET having a gate, a drain and a source;
    b) a NFET, the NFET having a gate, a drain and a source;
    c) wherein the source of the PFET is connected to VDD;
    d) wherein the source of the NFET is connected to GND;
    e) wherein the gates of the NFET and the PFET are the input of the input driver;
    f) wherein the drains of the NFET and the PFET are the output of the input driver.

3. The triple redundant latch as in claim 1 wherein the first transfer gate comprises:
    a) a PFET, the PFET having a gate, a drain and a source;
    b) a NFET, the NFET having a gate, a drain and a source;
    c) wherein the drains of the PFET and the NFET are connected to the input of the first transfer gate;
    d) wherein the sources of the PFET and the NFET are connected to the output of the first transfer gate;
    e) wherein the gate of the NFET is connected to the first control input of the first transfer gate;
    f) wherein the gate of the PFET is connected to the second control input of the first transfer gate.

4. The triple redundant latch as in claim 1 wherein the second transfer gate comprises:
    a) a PFET, the PFET having a gate, a drain and a source;
    b) a NFET, the NFET having a gate, a drain and a source;
    c) wherein the drains of the PFET and the NFET are connected to the input of the second transfer gate;
    d) wherein the sources of the PFET and the NFET are connected to the output of the second transfer gate;
    e) wherein the gate of the NFET is connected to the first control input of the second transfer gate;
    f) wherein the gate of the PFET is connected to the second control input of the second transfer gate.

5. The triple redundant latch as in claim 1 wherein the first latch comprises:
    a) a first PFET, the first PFET having a gate, a drain and a source;
    b) a second PFET, the second PFET having a gate, a drain and a source;
    c) a first NFET, the first NFET having a gate, a drain and a source;
    d) a second NFET, the second NFET having a gate, a drain and a source;
    e) wherein the sources of the first and second PFETs are connected to VDD;
    f) wherein the sources of the first and second NFETs are connected to GND;
    g) wherein the gate of the first NFET and the gate of the first PFET are the input/output of the first latch;
    h) wherein the drain of the first NFET and the drain of the first PFET are connected to the gate of the second NFET and the gate of the second PFET;
    i) wherein the drain of the second NFET and the drain of the second PFET are the input/output of the first latch.

6. The triple redundant latch as in claim 1 wherein the second latch comprises:
    a) a first PFET, the first PFET having a gate, a drain and a source;
    b) a second PFET, the second PFET having a gate, a drain and a source;
    c) a first NFET, the first NFET having a gate, a drain and a source;
    d) a second NFET, the second NFET having a gate, a drain and a source;
    e) wherein the sources of the first and second PFETs are connected to VDD;
    f) wherein the sources of the first and second NFETs are connected to GND;
    g) wherein the gate of the first NFET and the gate of the first PFET are the input/output of the second latch;
    h) wherein the drain of the first NFET and the drain of the first PFET are connected to the gate of the second NFET and the gate of the second PFET;
    i) wherein the drain of the second NFET and the drain of the second PFET are the input/output of the second latch.

7. The triple redundant latch as in claim 1 wherein the third latch comprises:
   a) a first PFET, the first PFET having a gate, a drain and a source;
   b) a second PFET, the second PFET having a gate, a drain and a source;
   c) a first NFET, the first NFET having a gate, a drain and a source;
   d) a second NFET, the second NFET having a gate, a drain and a source;
   e) wherein the sources of the first and second PFETs are connected to VDD;
   f) wherein the sources of the first and second NFETs are connected to GND;
   g) wherein the gate of the first NFET and the gate of the first PFET are the input/output of the third latch;
   h) wherein the drain of the first NFET and the drain of the first PFET are connected to the gate of the second NFET and the gate of the third PFET;
   i) wherein the drain of the second NFET and the drain of the second PFET are the input/output of the third latch.

8. The triple redundant latch as in claim 1 wherein the tristatable input inverter comprises:
   a) a first PFET, the first PFET having a gate, a drain and a source;
   b) a second PFET, the second PFET having a gate, a drain and a source;
   c) a first NFET, the first NFET having a gate, a drain and a source;
   d) a second NFET, the second NFET having a gate, a drain and a source;
   e) wherein the source of the first PFET is connected to VDD;
   f) wherein the source of the second NFET is connected to GND;
   g) wherein the drain of the first PFET is connected to the source of the second PFET;
   h) wherein the drain of the second PFET and the drain of the first NFET are the output of the tristatable input inverter;
   i) wherein the source of the first NFET is connected to the drain of the second NFET;
   j) wherein the gate of the first PFET and the gate of the second NFET is the first input of the tristatable input inverter;
   k) wherein the gate of the second PFET and the gate of the first NFET is the second input of the tristatable input inverter.

9. The triple redundant latch as in claim 1 wherein the output driver comprises:
   a) a PFET, the PFET having a gate, a drain and a source;
   b) a NFET, the NFET having a gate, a drain and a source;
   c) wherein the source of the PFET is connected to VDD;
   d) wherein the source of the NFET is connected to GND;
   e) wherein the gates of the NFET and the PFET are the input of the first output driver;
   f) wherein the drains of the NFET and the PFET are the output of the first output driver.

10. A method of manufacturing a triple redundant latch with improved soft error rate comprising:
   a) fabricating an input driver, the input driver having an input and an output;
   b) fabricating a first transfer gate, the first transfer gate having an input, a first control input, a second control input and an output;
   c) fabricating a second transfer gate, the second transfer gate having an input, a first control input, a second control input, and an output;
   d) fabricating a first latch, the first latch having an input/output;
   e) fabricating a second latch, the second latch having an input/output;
   f) fabricating a third latch, the third latch having an input/output;
   g) fabricating a tristatable input inverter, the tristatable input inverter having a first input, a second input, and an output;
   h) fabricating an output driver, the output driver having an input and an output;
   i) wherein the input of the input driver is the input of the triple redundant latch;
   j) wherein the output of the input driver is connected to the input of the first transfer gate and to the input of the second transfer gate;
   k) wherein a first control input of the triple redundant latch is connected to the first control input of the first latch and to the first control input of the second latch;
   l) wherein a second control input of the triple redundant latch is connected to the second control input of the first latch and to the second control input of the second latch;
   m) wherein the output of the first transfer gate is connected to the input/output of the first latch and to the first input of the tristatable inverter;
   n) wherein the output of the second transfer gate is connected to the input/output of the second latch and to the second input of the tristatable inverter;
   o) wherein the output of the tristatable inverter is connected to the input/output of the third latch and to the input of the output driver;
   p) wherein the output of the output driver is the output of the triple redundant latch.

11. The method of manufacturing a triple redundant latch as in claim 10 wherein input driver comprises:
   a) a PFET, the PFET having a gate, a drain and a source;
   b) a NFET, the NFET having a gate, a drain and a source;
   c) wherein the source of the PFET is connected to VDD;
   d) wherein the source of the NFET is connected to GND;
   e) wherein the gates of the NFET and the PFET are the input of the input driver;
   f) wherein the drains of the NFET and the PFET are the output of the first input driver.

12. The method of manufacturing a triple redundant latch as in claim 10 wherein the first transfer gate comprises:
   a) a PFET, the PFET having a gate, a drain and a source;
   b) a NFET, the NFET having a gate, a drain and a source;
   c) wherein the drains of the PFET and the NFET are connected to the input of the first transfer gate;
   d) wherein the sources of the PFET and the NFET are connected to the output of the first transfer gate;
   e) wherein the gate of the NFET is connected to the first control input of the first transfer gate;
   f) wherein the gate of the PFET is connected to the second control input of the first transfer gate.

13. The method of manufacturing a triple redundant latch as in claim 10 wherein the second transfer gate comprises:
   a) a PFET, the PFET having a gate, a drain and a source;
   b) a NFET, the NFET having a gate, a drain and a source;
   c) wherein the drains of the PFET and the NFET are connected to the input of the second transfer gate;
   d) wherein the sources of the PFET and the NFET are connected to the output of the second transfer gate;
   e) wherein the gate of the NFET is connected to the first control input of the second transfer gate;
   f) wherein the gate of the PFET is connected to the second control input of the second transfer gate.

14. The method of manufacturing a triple redundant latch as in claim 10 wherein the first latch comprises:
   a) a first PFET, the first PFET having a gate, a drain and a source;
   b) a second PFET, the second PFET having a gate, a drain and a source;
   c) a first NFET, the first NFET having a gate, a drain and a source;
   d) a second NFET, the second NFET having a gate, a drain and a source;
   e) wherein the sources of the first and second PFETs are connected to VDD;
   f) wherein the sources of the first and second NFETs are connected to GND;
   g) wherein the gate of the first NFET and the gate of the first PFET are the input/output of the first latch;
   h) wherein the drain of the first NFET and the drain of the first PFET are connected to the gate of the second NFET and the gate of the second PFET;
   i) wherein the drain of the second NFET and the drain of the second PFET are the input/output of the first latch.

15. The method of manufacturing a triple redundant latch as in claim 10 wherein the second latch comprises:
   a) a first PFET, the first PFET having a gate, a drain and a source;
   b) a second PFET, the second PFET having a gate, a drain and a source;
   c) a first NFET, the first NFET having a gate, a drain and a source;
   d) a second NFET, the second NFET having a gate, a drain and a source;
   e) wherein the sources of the first and second PFETs are connected to VDD;
   f) wherein the sources of the first and second NFETs are connected to GND;
   g) wherein the gate of the first NFET and the gate of the first PFET are the input/output of the second latch;
   h) wherein the drain of the first NFET and the drain of the first PFET are connected to the gate of the second NFET and the gate of the second PFET;
   i) wherein the drain of the second NFET and the drain of the second PFET are the input/output of the second latch.

16. The method of manufacturing a triple redundant latch as in claim 10 wherein the third latch comprises:
   a) a first PFET, the first PFET having a gate, a drain and a source;
   b) a second PFET, the second PFET having a gate, a drain and a source;
   c) a first NFET, the first NFET having a gate, a drain and a source;
   d) a second NFET, the second NFET having a gate, a drain and a source;
   e) wherein the sources of the first and second PFETs are connected to VDD;
   f) wherein the sources of the first and second NFETs are connected to GND;
   g) wherein the gate of the first NFET and the gate of the first PFET are the input/output of the third latch;
   h) wherein the drain of the first NFET and the drain of the first PFET are connected to the gate of the second NFET and the gate of the third PFET;
   i) wherein the drain of the second NFET and the drain of the second PFET are the input/output of the third latch.

17. The method of manufacturing a triple redundant latch as in claim 10 wherein the tristatable input inverter comprises:
   a) a first PFET, the first PFET having a gate, a drain and a source;
   b) a second PFET, the second PFET having a gate, a drain and a source;
   c) a first NFET, the first NFET having a gate, a drain and a source;
   d) a second NFET, the second NFET having a gate, a drain and a source;
   e) wherein the source of the first PFET is connected to VDD;
   f) wherein the source of the second NFET is connected to GND;
   g) wherein the drain of the first PFET is connected to the source of the second PFET;
   h) wherein the drain of the second PFET and the drain of the first NFET are the output of the tristatable input inverter;
   i) wherein the source of the first NFET is connected to the drain of the second NFET;
   j) wherein the gate of the first PFET and the gate of the second NFET is the first input of the tristatable input inverter;
   k) wherein the gate of the second PFET and the gate of the first NFET is the second input of the tristatable input inverter.

18. The method of manufacturing a triple redundant latch as in claim 10 wherein the output driver comprises:
   a) a PFET, the PFET having a gate, a drain and a source;
   b) a NFET, the NFET having a gate, a drain and a source;
   c) wherein the source of the PFET is connected to VDD;
   d) wherein the source of the NFET is connected to GND;
   e) wherein the gates of the NFET and the PFET are the input of the first output driver;
   f) wherein the drains of the NFET and the PFET are the output of the output driver.

* * * * *

UNITED STATES PATENT AND TRADEMARK OFFICE
CERTIFICATE OF CORRECTION

PATENT NO. : 6,882,201 B1　　　　　　　　　　　　　　　　　　　　　　Page 1 of 1
APPLICATION NO. : 10/754075
DATED : April 19, 2005
INVENTOR(S) : Kenneth Koch, II, et al.

It is certified that error appears in the above-identified patent and that said Letters Patent is hereby corrected as shown below:

IN THE CLAIMS

Claim 9, Column 9, line 61, before "output" delete "first"

Claim 9, Column 9, line 63, before "output" delete "first"

Claim 11, Column 10, line 54, before "input" delete "first"

Claim 18, Column 12, line 60, before "output" delete "first"

Signed and Sealed this

Third Day of June, 2008

JON W. DUDAS
*Director of the United States Patent and Trademark Office*